(12) United States Patent
Miyazaki et al.

(10) Patent No.: US 7,808,835 B2
(45) Date of Patent: Oct. 5, 2010

(54) NON-VOLATILE SEMICONDUCTOR STORAGE DEVICE

(75) Inventors: Hirokazu Miyazaki, Kanagawa (JP); Katsuaki Matsui, Kanagawa (JP); Tsutomu Higuchi, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/408,896

(22) Filed: Mar. 23, 2009

(65) Prior Publication Data

US 2009/0180327 A1 Jul. 16, 2009

Related U.S. Application Data

(63) Continuation of application No. 11/785,527, filed on Apr. 18, 2007, now Pat. No. 7,525,845.

(30) Foreign Application Priority Data

Jul. 28, 2006 (JP) ............................. 2006-207024
Jan. 5, 2007 (JP) ............................. 2007-000688

(51) Int. Cl.
*G11C 11/34* (2006.01)
(52) U.S. Cl. .............................. 365/185.25; 365/185.12
(58) Field of Classification Search ............ 365/185.25, 365/185.12
See application file for complete search history.

(56) References Cited

U.S. PATENT DOCUMENTS

| 5,886,937 A | * | 3/1999 | Jang ........................... 365/203 |
| 6,147,912 A | * | 11/2000 | Kitazawa ................ 365/189.02 |
| 6,473,327 B1 | * | 10/2002 | Ishizuka ..................... 365/103 |
| 6,980,472 B2 | | 12/2005 | Ditewig et al. |

FOREIGN PATENT DOCUMENTS

| JP | 2005512268 | 4/2005 |
| WO | 03050813 A2 | 6/2003 |

* cited by examiner

*Primary Examiner*—Anh Phung
(74) *Attorney, Agent, or Firm*—Volentine & Whitt, P.L.L.C.

(57) ABSTRACT

In a memory cell array which is constituted with flash memory, a pair of a positive memory cell and a negative memory cell, to which data with mutually opposite values are written, is plurally provided. Bit lines and I/O lines connected to the memory cells of a data reading object are charged, and then a potential WL of a word line connected to the data reading object memory cells is raised. Hence, currents flow in the data reading object memory cells in accordance with the data that were written, and consequently one of a potential BL and a potential BLN of the I/O lines begins to fall. When one of the potentials BL and BLN falls below the circuit threshold of a sense amplifier, reading data is established, and the established reading data is outputted as a sense amplifier output signal SAOUT.

12 Claims, 6 Drawing Sheets

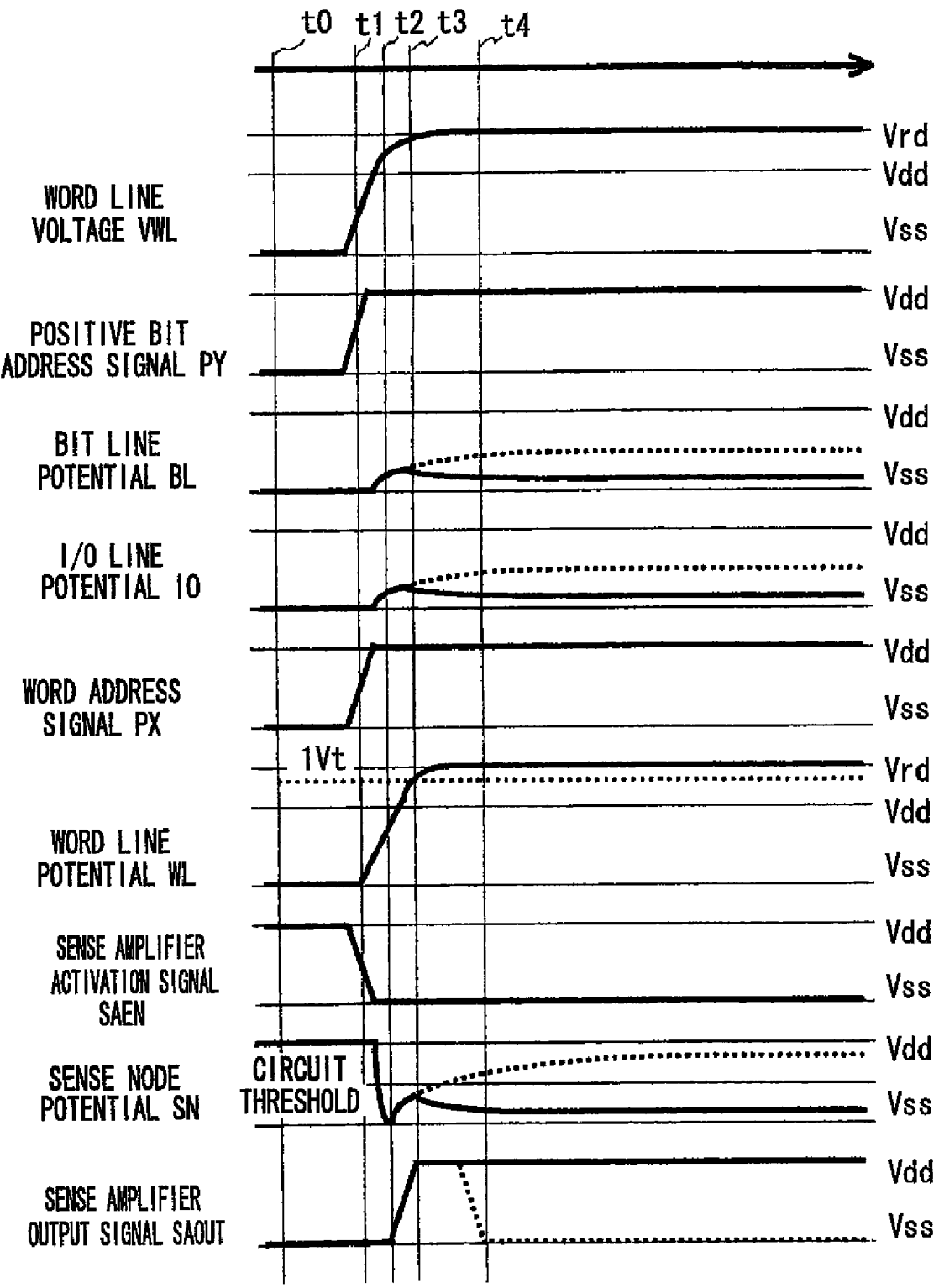

US 7,808,835 B2

NON-VOLATILE SEMICONDUCTOR STORAGE DEVICE

CROSS-REFERENCE TO RELATED APPLICATION

This is a continuation application of application Ser. No. 11/785,527, filed on Apr. 18, 2007, now U.S. Pat. No. 7,525,845, issued on Apr. 28, 2009, which is hereby incorporated by reference in its entirety for all purposes.

This application claims priority under 35 USC 119 from Japanese Patent Application Nos. 2006-207024 and 2007-000688, the disclosures of which are incorporated by reference herein.

BACKGROUND OF THE INVENTION

1. Field of the Invention

The present invention relates to a non-volatile semiconductor storage device, and more particularly to a non-volatile semiconductor storage device of flash memory or the like.

2. Description of the Related Art

Firstly, an example of structure of a conventional flash memory storage device will be described with reference to FIG. 5. A flash memory storage device 20 shown in FIG. 5 is provided with a memory cell array 22 constituted of flash memory. In the memory cell array 22, numerous memory cells 24, which are formed of transistors with floating gates, are arranged in a matrix. The memory cell array 22 is also provided with a plurality of word lines 26. The gate electrodes of the individual memory cells 24 are each connected to one or other of the word lines 26. The word lines 26 are each connected to one of a plurality of address signal lines 30 via a word line driver 28. The memory cell array 22 is further provided with a plurality of source lines 32. The source electrodes of the individual memory cells 24 are each connected to one or other of the plural source lines 32. The memory cell array 22 is yet further provided with a plurality of bit lines 34. The drain electrodes of the individual memory cells 24 are each connected to one or other of the plural bit lines 34.

The plural bit lines 34 are each connected to a bit line selection gate 36. Each bit line selection gate 36 is structured by an N-type transistor 42 and an N-type transistor 48. The bit line 34 is connected to the source electrode of the N-type transistor 42, the gate electrode of the N-type transistor 42 is connected to one of a plurality of positive bit address signal lines 38, and the drain electrode of the N-type transistor 42 is connected to an I/O line 40. At each N-type transistor 48, one of a plurality of negative bit address signal lines 46, which are connected to the respective positive bit address signal lines 38 via inverters 44, is connected to the gate electrode of the N-type transistor 48, the bit line 34 is connected to the drain electrode of the N-type transistor 48, and a reference voltage Vss is supplied to the drain electrode of the N-type transistor 48.

The I/O line 40 is connected to a sense amplifier 50. The sense amplifier 50 is structured with an inverter 52, an N-type transistor 54, an N-type transistor 56, a P-type transistor 58, an inverter 60 and a P-type transistor 62. A sense amplifier activation signal SAEN is inputted to the inverter 52. The sense amplifier activation signal SAEN is inputted to the gate electrode of the N-type transistor 54, the I/O line 40 is connected to the drain electrode of the N-type transistor 54, and the reference voltage Vss is supplied to the source electrode of the N-type transistor 54. The output terminal of the inverter 52 is connected to the gate electrode of the N-type transistor 56, the drain electrode of the N-type transistor 56 is connected to a sense node SN, and the I/O line 40 is connected to the source electrode of the N-type transistor 56. The output terminal of the inverter 52 is connected to the gate electrode of the P-type transistor 58, the drain electrode of the P-type transistor 58 is connected to the sense node SN, and a power supply voltage Vdd is supplied to the source electrode of the P-type transistor 58. The input terminal of the inverter 60 is connected to the sense node SN. The gate electrode and drain electrode of the P-type transistor 62 are connected to the sense node SN, and the power supply voltage Vdd is supplied to the source electrode of the P-type transistor 62.

A data-reading operation for the memory cell array 22 of the flash memory storage device 20 with the structure described above will be described with reference to FIG. 6. At a time t=t0 shown in FIG. 6, the flash memory storage device 20 is in a standby state, and a word line voltage VWL supplied to the word line drivers 28 and potentials WL of each of the word lines 26 are all at the reference voltage Vss. Further, in the standby state, word address signals PX which are propagated by the plural address signal lines 30 and positive bit address signals PY which are propagated by the plural positive bit address signal lines 38 are at the reference voltage Vss. The N-type transistors 42 of each of the bit line selection gates 36 are all off, and the N-type transistors 48 are all on. Thus, potentials BL of the individual bit lines 34 are at the reference voltage Vss. Furthermore, in the standby state, the sense amplifier activation signal SAEN being supplied to the sense amplifier 50 is at the power supply voltage Vdd, the N-type transistor 54 of the sense amplifier 50 is on, and the N-type transistor 56 is off. Thus, a potential IO of the I/O line 40 is at the reference voltage Vss. Further yet, the P-type transistor 58 is on, the potential of the sense node SN is at the power supply voltage Vdd, and a sense amplifier output signal SAOUT is at the reference voltage Vss.

Now, at a data-reading operation commencement time at a time t=t1, the word line voltage VWL supplied to the word line drivers 28 is raised by an unillustrated booster circuit and starts to rise toward a voltage Vrd (Vrd is greater than a threshold Vt of the memory cells 24). Further, at the time t=t1, the signal address signal PX which designates the memory cell 24 that is the object of reading is propagated through the address signal line 30. Thus, the word line 26 that is connected to the reading object memory cell 24 is selected by the word line driver 28. Because the word line voltage VWL is supplied to the selected word line 26, the potential WL of the selected word line 26 also starts to rise toward the voltage Vrd. Furthermore, at the time t=t1, the positive bit address signal PY which designates the reading object memory cell 24 is propagated through the positive bit address signal line 38. Thus, at the bit line selection gate 36 which is connected to the bit line 34 that is connected to the reading object memory cell 24, the N-type transistor 42 turns on and the N-type transistor 48 turns off, and thus the bit line 34 connected to the reading object memory cell 24 is connected to the I/O line 40.

Moreover, at the time t=t1, the sense amplifier activation signal SAEN switches from the power supply voltage Vdd to the reference voltage Vss. As a result, the N-type transistor 54 and P-type transistor 58 of the sense amplifier 50 turn off and the N-type transistor 56 turns on, and the sense node SN is cut off from the supply of the power supply voltage Vdd and connected to the I/O line 40. At this time, the potential of the sense node SN is determined by positive charge accumulated at a capacitance of the sense node SN and negative charge accumulated at a capacitance of the bit line 34 and the I/O line 40. However, the capacitance of the sense node SN is much smaller than the capacitance of the bit line 34 and the I/O line 40, and thus the positive charge accumulated at the capacitance of the sense node SN is discharged, and the potential of the sense node SN falls below a circuit threshold of the sense amplifier 50.

Then, at a time t=t2, because the potential WL of the word line 26 connected to the reading object memory cell 24 is below the threshold Vt of the memory cell 24, the memory cell 24 is not on, regardless of the value of a datum which has been written to the reading object memory cell 24. However, when the potential of the sense node SN falls below the circuit threshold of the sense amplifier 50, the P-type transistor 62 turns on, and the sense node SN, the I/O line 40 and the bit line 34 are charged up by current flowing through the P-type transistor 62. Thus, the potential of the sense node SN, the potential IO of the I/O line 40 and the potential BL of the bit line 34 rise.

Then, at a time t=t3, the potential WL of the word line 26 connected to the reading object memory cell 24 rises above the threshold Vt of the memory cell 24. If a data one has been written to the reading object memory cell 24, the memory cell 24 turns on. In this case, the potential of the sense node SN, the potential IO of the I/O line 40 and the potential BL of the bit line 34 are determined by a ratio of current flowing through the turned-on memory cell 24 to current flowing through the P-type transistor 62. Here, the current flowing through the P-type transistor 62 is smaller than the current flowing through the memory cell 24, and thus the potential of the sense node SN falls, and is below the circuit threshold of the sense amplifier 50. As a result, the power supply voltage Vdd is outputted as the sense amplifier output signal SAOUT from the inverter 60 (i.e., reading data=one).

On the other hand, if a data zero has been written to the reading object memory cell 24, the reading object memory cell 24 stays off. In this case too, the potential of the sense node SN, the potential IO of the I/O line 40 and the potential BL of the bit line 34 are determined by a ratio of current flowing through the turned-off memory cell 24 to current flowing through the P-type transistor 62. Here, the current flowing through the turned-off memory cell 24 is smaller than the current flowing through the P-type transistor 62, and thus the potential of the sense node SN rises, and rises above the circuit threshold of the sense amplifier 50. As a result, the reference voltage Vss is outputted as the sense amplifier output signal SAOUT (reading data) from the inverter 60 (i.e., the reading data=zero).

With regard to the above description, Japanese National publication No. 2005-512268 discloses a technology in which a flash memory has a structure provided with a charge-storing transistor, with a charge-storing gate, and a selection transistor, with a selection gate. When the selection gate is being switched from a first voltage to a second voltage, the charge-storing gate is kept floating by a switching circuit, and the first voltage is set lower than the second voltage.

Recently, flash memories, which are non-volatile memories, have fallen in cost and accordingly have been used in a greater variety of applications. Particularly in regard to flash memories for portable devices, a lowering of operating voltages has been sought with a view to reducing current consumption (power consumption). However, there is a problem with flash memory storage devices with structures as shown in FIG. 5 in that, if operating voltages are lowered, data-reading operations become unstable.

That is, with the flash memory storage device 20 shown in FIG. 5, in order to accurately read data from the memory cell array 22, the circuit must be designed such that, if a current flowing through the P-type transistor 62 is Ip, and a minimum value of a current Ion that flows through the turned-on memory cell 24 is Ionmin and a maximum value of a current Ioff that flows through the turned-off memory cell 24 is Ioffmax, the following condition is always satisfied.

$$Ioffmax < Ip < Ionmin$$

The currents Ion and Ioff will vary with operating voltage, ambient temperature and the like, but a difference between the current Ion and the current Ioff can be increased by setting an operating voltage (the power supply voltage Vdd) sufficiently high. Accordingly, a sufficient difference between the current Ioffmax and the current Ionmin can be assured, and designing the circuit so as to satisfy the above condition is facilitated.

However, if the operating voltage is lowered, the current Ion is lowered. Moreover, Ion also changes in accordance with a threshold voltage Vtc of the memory cell 24, and when the operating voltage is lowered, a change in the threshold voltage Vtc has a greater effect on the current Ion (that is, a gradient of change of the current Ion with respect to changes in the threshold voltage Vtc is large). Therefore, the current Ion is affected by variations in the threshold voltage Vtc of the individual memory cells 24 which are caused by fabrication variations in the memory cell array 22, and as the operating voltage is lowered, the current Ionmin will have quite a small value. Thus, with a reduction of the operating voltage, the difference between the current Ioffmax and the current Ionmin becomes very small.

In addition, the current Ip which flows through the P-type transistor 62 changes in accordance with a threshold voltage Vtp of the P-type transistor 62, and when the operating voltage is lowered, a change in the threshold voltage Vtp has a greater effect on the current Ip (that is, a gradient of change of the current Ip with respect to changes in the threshold voltage Vtp is large). Therefore, because the current Ip is affected by variations in the threshold voltage Vtp of individual P-type transistors 62 which are caused by fabrication variations of the P-type transistors 62, as the operating voltage is lowered, a range of variation of the current Ip will be large. Thus, when the operating voltage is lowered, it is difficult to design a circuit such that the above-mentioned condition is always satisfied, and data-reading operations become unstable.

In Japanese National Publication No. 2005-512268, structuring a flash memory cell with two transistors (the charge-storing transistor and the selection transistor) is disclosed. However, a technique for realizing an improvement in stability of data-reading operations if the operating voltage is lowered is not mentioned at all.

SUMMARY OF THE INVENTION

The present invention has been devised in consideration of the circumstances described above, and is to provide a non-volatile semiconductor storage device capable of improving stability of data-reading operations if an operating voltage is lowered.

An aspect of the present invention is a non-volatile storage section at which a pair of memory cells to which data with mutually opposite values are written is plurally provided; and a detector which, when a selection signal is respectively inputted to the memory cell pair that is a data-reading object, detects the data that have been written to the data-reading object memory cell pair on the basis of a magnitude relationship of voltages of a first signal line and a second signal line, which are connected to different memory cells of the data-reading object memory cell pair, after a voltage of one of the first and second signal lines has changed across a threshold due to currents corresponding to the data written to the data-reading object memory cell pair respectively flowing in the data-reading object memory cell pair.

In the non-volatile storage section of the present aspect, the memory cell pairs which are written with data with mutually opposite values are plurally provided. The selection signal is inputted to each of a memory cell pair which is an object of data-reading. As a result, at each of the data-reading object memory cell pair, currents flow in accordance with the data that have been written to each of that memory cell pair. In the present aspect, because data with mutually opposite values have been written to the memory cell pair, the sizes of the respective currents that flow in the two data-reading object memory cells when the selection signal is inputted differ. Now, if an operating voltage is lowered, the difference between the respective currents that flow in the data-reading object memory cell pair will be smaller.

However, when a current flows in a memory cell, the voltage of a signal line connected to that memory cell changes rapidly in accordance with the size of the current flowing in the memory cell. Therefore, even when the difference between the respective currents flowing in the data-reading object memory cell pair is small, the voltages of the first signal line and second signal line connected to the respectively differing memory cells of the data-reading object memory cell pair exhibit changes corresponding to time-integrals of the currents flowing in the connected memory cells, and a clear difference emerges as time progresses. On the basis of the above, due to the currents respectively flowing in the data-reading object memory cell pair in accordance with the data that were respectively written to the data-reading object memory cell pair, the voltage of one of the first signal line and second signal line changes to cross the threshold, and then the detector senses the data that were written to the data-reading object memory cell pair, on the basis of which of the voltages of the first and second signal lines is larger.

Thus, in the present aspect, instead of data written to a data-reading object memory cell being sensed on the basis of the absolute size of a current flowing through the memory cell as is conventional, the voltages of the first and second signal lines are altered by the respective currents flowing through the data-reading object memory cell pair, and this continues until one voltage changes across a threshold. Thus, the difference between the respective currents flowing in the data-reading object memory cell pair is amplified and is reflected in the difference between the voltages of the first and second signal lines. Hence, the data that have been written to the data-reading object memory cell pair are detected on the basis of a magnitude relationship of the voltages of the first and second signal lines after the voltage of one of the first and second signal lines has changed across the threshold. Therefore, even if the operating voltage is lowered and accordingly the difference between the respective currents flowing in the data-reading object memory cell pair is small, the data that were written to the data-reading object memory cell pair can be reliably detected, and an improvement in stability of data-reading operations when the operating voltage has been lowered can be realized.

The present aspect may further include a charging section which charges the first signal line and the second signal line, wherein the detector respectively inputs the selection signal to the data reading object memory cell pair after the first and second signal lines have been charged by the charging section.

In this case, after the voltages of the first and second signal lines have risen to a certain threshold due to being charged up by the charging section, the voltages fall at rates corresponding to the sizes of the currents flowing through the connected memory cells. Hence, after the voltage of one of the first and second signal lines has fallen below the aforementioned threshold, the data that were written to the data-reading object memory cell pair are detected on the basis of which is larger of the voltages of the first and second signal lines.

Furthermore, in the present aspect, the detector may include a detection circuit which (a) while neither of the voltages of the first and second signal lines has changed across the threshold, outputs a first output signal and a second output signal which are signals at the same level, and (b) when the voltage of one of the first and second signal lines changes across the threshold, causes the levels of the first and second output signals to differ, and switches a magnitude relationship of the levels of the first and second output signals in accordance with whether the signal line whose voltage has changed across the threshold is the first signal line or the second signal line, and the detector may output one of the first and second output signals as reading data.

Thus, on the basis of the levels of the first and second output signals which are outputted from the detection circuit of the detector, a circuit external to the detector can determine whether or not the voltage of either of the first and second signal lines has changed across the threshold (that is, whether or not reading data has been established).

Furthermore, the present aspect may further include an operation-stopping controller which, with the change of the voltage of one of the first and second signal lines across the threshold as a trigger, stops operations of peripheral circuits, including the charging section and the detector.

Now, if the detector has, for example, the structure described above, the change of the voltage of one of the first and second signal lines across the threshold can be detected by sensing whether or not the levels of the first and second output signals which are outputted from the detection circuit of the detector have switched from matching levels to a state in which the levels are different.

With this structure, when the voltage of one of the first and second signal lines changes across the threshold and the reading data is established, operations of peripheral circuits, including the charging section and the detector, are stopped by the operation-stopping controller. Thus, current consumption (power consumption) of the non-volatile semiconductor storage device relating to the present invention can be reduced.

Furthermore, the present aspect may further include a latching section which, with the change of the voltage of one of the first and second signal lines across the threshold as a trigger, latches reading data outputted from the detector.

Now, if the detector has, for example, the structure described above, the change of the voltage of one of the first and second signal lines across the threshold can be detected by sensing whether or not the levels of the first and second output signals which are outputted from the detection circuit of the detector have switched from matching levels to a state in which the levels are different. For example, if the structure is provided with the operation-stopping controller, this can be detected by sensing whether or not a signal for stopping operations of peripheral circuits has been outputted from an operation-stopping section thereof.

With this structure, when the voltage of one of the first and second signal lines changes across the threshold and the reading data is established, the reading data outputted from the detector is latched by the latching section. Therefore, even with, for example, the structure in which the operations of peripheral circuits are stopped by the operation-stopping controller when the reading data has been established, the reading data can be reliably retained.

Now, the device may have a structure in which the non-volatile storage section is provided with a plurality of bit lines, each memory cell provided at the non-volatile storage section being connected to one of the plurality of bit lines such that the two memory cells that structure one of the memory cell pairs to which data with mutually opposite values are written are connected to mutually different bit lines of the plurality of bit lines. As mentioned above, the first signal line and second signal line connected to the mutually differing memory cells of the data-reading object memory cell pair may be pre-charged before the selection signal is inputted to each of the data-reading object memory cell pair. In such a case, it is desirable to also pre-charge (i.e., before input of the selection signal) the bit lines provided at the non-volatile storage section before respectively inputting the selection signal to the data-reading object memory cell pair.

This charging of the bit lines may be applied to all the bit lines provided in the non-volatile storage section. However, ordinarily, numerous memory cells will be arranged in a matrix in the non-volatile storage section, and there will be many cases in which pluralities of the memory cells which are connected to mutually different bit lines are respectively connected to signal lines (word lines), which are provided at the non-volatile memory section for inputting selection signals to the memory cells. Therefore, if a structure were to be employed in which all the bit lines provided in the non-volatile storage section are pre-charged, the selection signal would also be inputted to memory cells which were not data-reading objects but were connected to the same word line as the data-reading object memory cell pair, and currents corresponding to the data that had been written to these memory cells (discharging currents) would flow, and thus there would be a problem in that current consumption (power consumption) at a time of data-reading would be large.

In consideration of the above, in a structure provided with the charging section, if plural bit lines are provided in the non-volatile storage section and each memory cell provided in the non-volatile storage section is connected to one or other of the plurality of bit lines such that the two memory cells that structure a memory cell pair to which mutually opposite data are written are connected to mutually different bit lines of the plurality of bit lines, then, of the plurality of bit lines, the charging section charges, via the first signal line and the second signal line, only the two bit lines that are connected to the data reading object memory cell pair, and when detection by the detector of the data written to the data reading object memory cell pair has finished, the charging section discharges the two bit lines to a reference voltage.

Thus, when data are being read from the data-reading object memory cell pair (i.e., the data that were written to the data-reading object memory cell pair are being sensed by the detector), of the plurality of bit lines provided in the non-volatile storage section, the pair of bit lines connected to the data-reading object memory cell pair are charged up by the charging section via the first and second signal lines, but other bit lines are not charged up. Therefore, even when the non-volatile storage section has a structure in which the selection signal is inputted to memory cells other than the data-reading object memory cell pair, currents (discharging currents) corresponding to data that have been written can be prevented from flowing in memory cells to which the selection signal is inputted other than the data-reading object memory cell pair. As a result, power consumption at times of reading data from the non-volatile storage section can be reduced.

Furthermore, in a structure with the charging section, similarly to the first signal line and the second signal line, the voltages of the two bit lines connected to the data-reading object memory cell pair exhibit changes at a time of data-reading from the data-reading object memory cell pair with a clear difference emerging as time passes. However, because it is common for a non-volatile storage section to be formed as an integrated circuit, respective wires of the bit lines in the non-volatile storage section will essentially be close together. If a spacing between the two bit lines connected to the data-reading object memory cell pair in the non-volatile storage section is comparatively small, then when the voltages of the two bit lines change at the time of data-reading as described above, currents (voltage changes) flowing in the two bit lines will interfere with one another and the voltages will vary, and there will be a problem in that stability of data-reading from the non-volatile storage section will fall, such that data misreads occur and the like.

In consideration of the above, at the non-volatile storage section in which the memory cell pairs are plurally provided, the plurality of cell pairs and the plurality of bit lines may be arranged such that, between the two bit lines that are connected to the two memory cells structuring one of the memory cell pairs, bit lines that are connected to the memory cells of other memory cell pairs are disposed.

Thus, a pair of bit lines are connected to a pair of memory cells, and bit lines connected to memory cells of other memory cell pairs, which are disposed between the pair of bit lines, are utilized as shield lines. Accordingly, the currents (voltage changes) flowing along that pair of bit lines can be prevented from interfering with one another and varying the voltages, and stability of data-reading from the non-volatile storage section can be improved.

According to the structures as described above, the present invention can realize an improvement in stability of data-reading operations in a case in which the voltage level of an operating voltage is reduced.

BRIEF DESCRIPTION OF THE DRAWINGS

Exemplary embodiments of the present invention will be described in detail based on the following figures, wherein:

FIG. 6 is a timing chart for describing operations of the flash memory storage device shown in FIG. 5.

DETAILED DESCRIPTION OF THE INVENTION

First Exemplary Embodiment

Figure 1:
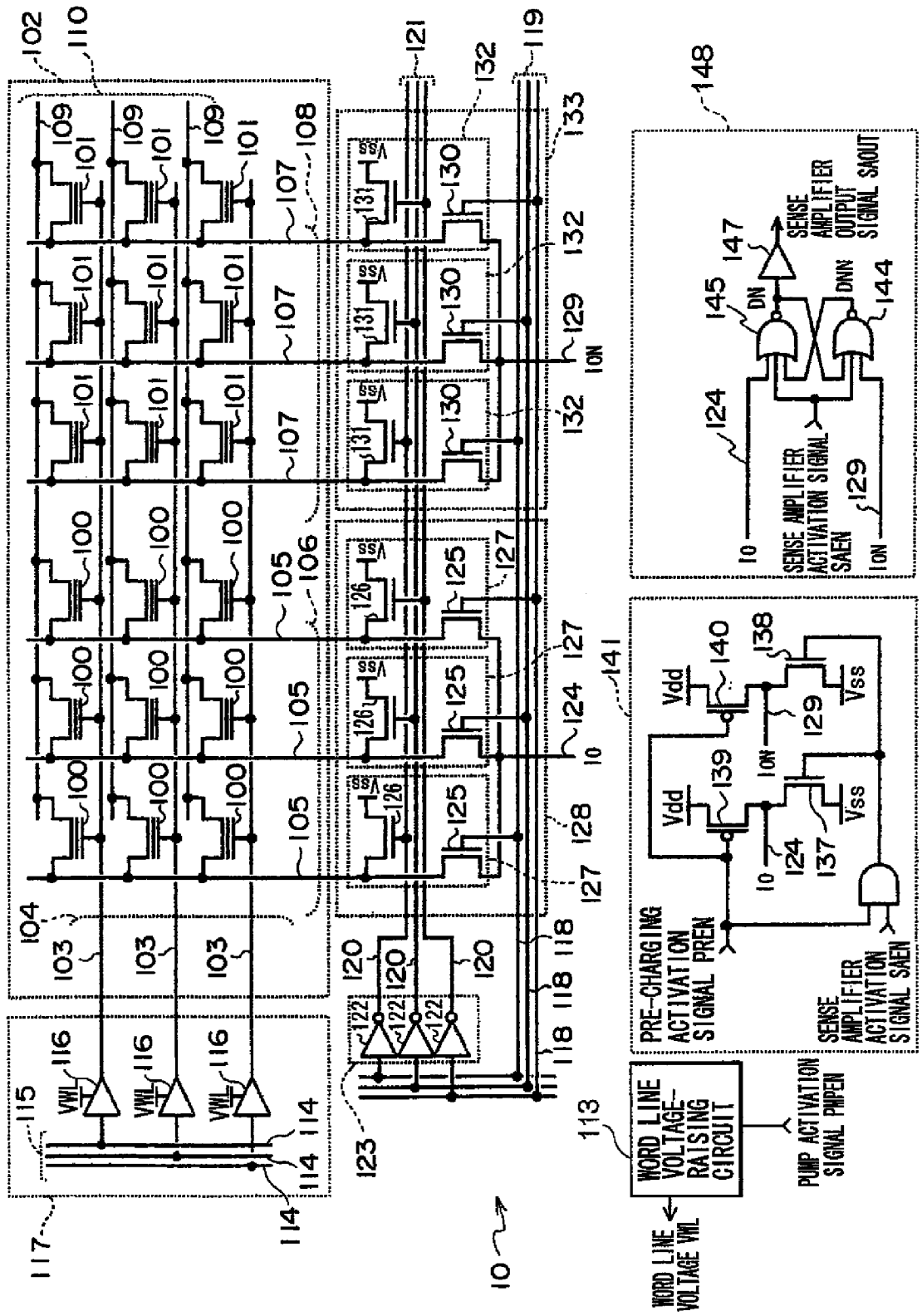
FIG. 1 is a circuit diagram of a non-volatile semiconductor storage device relating to a first exemplary embodiment.

FIG. 1 shows a non-volatile semiconductor storage device 10 relating to this first exemplary embodiment. The non-volatile semiconductor storage device 10 is provided with a memory cell array 102 which is constituted by flash memory to serve as a non-volatile storage section. In the memory cell array 102, numerous flash memory cells formed of transistors with floating gates are arranged in a matrix pattern. Of the numerous memory cells provided in the memory cell array 102, half of the memory cells are employed as positive memory cells 100 and the rest of the memory cells are employed as negative memory cells 101. Each negative memory cell 101 corresponds with a mutually differing positive memory cell 100, and each negative memory cell 101 is written with a respective datum whose value is inverted from a datum that is written to the corresponding positive memory cell 100.

The memory cell array 102 is provided with a word line group 104 constituted of a plurality of word lines 103. Gate electrodes of the individual memory cells 100 and 101 are respectively connected to one or other of the plurality of word lines 103 such that a corresponding positive memory cell 100 and negative memory cell 101 are both connected to the same word line 103. The memory cell array 102 is also provided with a source line group 110 constituted of a plurality (the same number as the word lines 103) of source lines 109. Source electrodes of the individual memory cells 100 and 101 are respectively connected to one or other of the plurality of source lines 109 such that a corresponding positive memory cell 100 and negative memory cell 101 are both connected to the same source line 109. The memory cell array 102 is further provided with a positive bit line group 106 constituted of a plurality of positive bit lines 105 and a negative bit line group 108 constituted of a plurality (the same number as the positive bit lines 105) of negative bit lines 107. Drain electrodes of the individual positive memory cells 100 are respectively connected to one or other of the plurality of positive bit lines 105, and drain electrodes of the individual negative memory cells 101 are respectively connected to one or other of the plurality of negative bit lines 107.

Herein, of the numerous memory cells provided at the memory cell array 102, the positive memory cell 100 half form a positive memory cell group structured by arranging all the positive memory cells 100 in a matrix, and the negative memory cell 101 other half form a negative memory cell group structured by arranging all the negative memory cells 101 in a matrix, which is disposed next to the positive memory cell group. Thus, the memory cell array 102 is divided into a region of arrangement of the positive memory cells 100 and a region of arrangement of the negative memory cells 101. Accordingly, in the memory cell array 102, each pair of a positive memory cell 100 and a negative memory cell 101 which are correspondingly provided in the memory cell array 102 is in a state in which plural bit lines connected to other memory cells are respectively disposed between the positive bit line 105 that is connected to that positive memory cell 100 and the negative bit line 107 that is connected to that negative memory cell 101. Thus, the memory cell array 102 corresponds in detail to the non-volatile semiconductor section of the present invention.

The word line group 104 of the memory cell array 102 is connected to a word line driver group 117. The non-volatile semiconductor storage device 10 is provided with a word address signal line group 115 structured by word address signal lines 114, which are provided in the same number as the word lines 103 and propagate word address signals PX. The word line driver group 117 is provided with word line drivers 116 in the same number as the word lines 103 and the word address signal lines 114. Input terminals of the word line drivers 116 are respectively connected to mutually different word address signal lines 114 of the plurality of word address signal lines 114, and output terminals are respectively connected to mutually different word lines 103 of the plurality of word lines 103. The non-volatile semiconductor storage device 10 is provided with a word line voltage-raising (booster) circuit 113, which inputs a pump activation signal PMPEN and outputs a word line voltage VWL. The word line voltage VWL outputted from the word line voltage-raising circuit 113 is supplied to each of the word line drivers 116 as a positive power supply voltage.

The non-volatile semiconductor storage device 10 is also provided with both a positive bit address signal line group 119 and a negative bit address signal line group 121. The positive bit address signal line group 119 is structured by positive bit address signal lines 118, which are provided in the same number as the positive bit lines 105 and the negative bit lines 107, and propagate positive bit address signals PY. The negative bit address signal line group 121 is structured by negative bit address signal lines 120, which are provided in the same number as the positive bit address signal lines 118 (and the positive bit lines 105 and the negative bit lines 107). The individual negative bit address signal lines 120 of the negative bit address signal line group 121 correspond with mutually different positive bit address signal lines 118 of the positive bit address signal line group 119. An inverter group 123, which is provided with inverters 122 in the same number as the positive bit address signal lines 118 and the negative bit address signal lines 120, is connected between the positive bit address signal line group 119 and the negative bit address signal line group 121. Input terminals of the inverters 122 of the inverter group 123 are respectively connected to mutually different positive bit address signal lines 118 of the positive bit address signal line group 119. Output terminals of the inverters 122 are respectively connected to mutually different negative bit address signal lines 120 of the negative bit address signal line group 121 (i.e., the negative bit address signal lines 120 corresponding to the positive bit address signal lines 118 to which the respective input terminals are connected). Thus, negative bit address signals PYN, for which the levels of the positive bit address signals PY supplied to the corresponding positive bit address signal lines 118 are inverted, are supplied to the individual negative bit address signal lines 120 of the negative bit address signal line group 121 by the inverter group 123.

A positive bit line selection gate group 128 is connected to the positive bit line group 106 of the memory cell array 102, and a negative bit line selection gate group 133 is connected to the negative bit line group 108 of the memory cell array 102. The positive bit line selection gate group 128 is provided with positive bit line selection gates 127 which are provided in the same number as the positive bit lines 105, and are connected to mutually different positive bit lines 105, mutually different positive bit address signal lines 118 and mutually different negative bit address signal lines 120. Each positive bit line selection gate 127 is structured with an N-type transistor 125 and an N-type transistor 126. The gate electrode of the N-type transistor 125 is connected to the positive bit address signal line 118, the drain electrode is connected to a positive I/O line 124, and the source electrode is connected to the positive bit line 105. The gate electrode of the N-type transistor 126 is connected to the negative bit address signal line 120, the drain electrode is connected to the positive bit line 105, and a reference voltage Vss is supplied to the source electrode. The N-type transistors 125 and 126 that are provided at one positive bit line selection gate 127 are connected to corresponding bit address signal lines 118 and 120.

The negative bit line selection gate group 133 is provided with negative bit line selection gates 132 which are provided in the same number as the negative bit line 107, and are connected to mutually different negative bit lines 107, mutually different positive bit address signal lines 118 and mutually different negative bit address signal lines 120. Each negative bit line selection gate 132 is structured with an N-type transistor 130 and an N-type transistor 131. The gate electrode of the N-type transistor 130 is connected to the positive bit address signal line 118, the drain electrode is connected to a negative I/O line 129, and the source electrode is connected to the negative bit line 107. The gate electrode of the N-type transistor 131 is connected to the negative bit address signal line 120, the drain electrode is connected to the negative bit line 107, and the reference voltage Vss is supplied to the source electrode. Each negative bit line selection gate 132 is connected to the same positive bit address signal line 118 and negative bit address signal line 120 as the corresponding positive bit line selection gate 127 (and thus to the positive bit line 105 corresponding to the negative bit line 107 that is connected thereto (for the present embodiment, bit lines 105 and 107 which are connected to corresponding memory cells 100 and 101 are referred to as "corresponding" to one another)).

The non-volatile semiconductor storage device 10 is further provided with a pre-charging circuit 141. The pre-charging circuit 141 is structured with a two-input AND gate 136, an N-type transistor 137, an N-type transistor 138, a P-type transistor 139, and a P-type transistor 140. At the two-input AND gate 136, a sense amplifier activation signal SAEN and a pre-charging activation signal PREN are inputted. The gate electrode of the N-type transistor 137 is connected to the output terminal of the two-input AND gate 136, the drain electrode is connected to the positive I/O line 124, and the reference voltage Vss is supplied to the source electrode. The gate electrode of the N-type transistor 138 is connected to the output terminal of the two-input AND gate 136, the drain electrode is connected to the negative I/O line 129, and the reference voltage Vss is supplied to the source electrode. At the P-type transistor 139, the pre-charging activation signal PREN is inputted at the gate electrode, the drain electrode is connected to the positive I/O line 124, and a power supply voltage Vdd is supplied to the source electrode. At the P-type transistor 140, the pre-charging activation signal PREN is inputted at the gate electrode, the drain electrode is connected to the negative I/O line 129, and the power supply voltage Vdd is supplied to the source electrode. Note that the pre-charging circuit 141 is an example of a charging section of the present invention. Moreover, the pre-charging circuit 141 together with the positive bit line selection gate group 128 and the negative bit line selection gate group 133 are also an example of the charging section of the present invention.

The non-volatile semiconductor storage device 10 is yet further provided with a sense amplifier 148. The sense amplifier 148 is structured with a three-input NOR gate 144, a three-input NOR gate 145 and a buffer 147. Of the three input terminals of the three-input NOR gate 144, the negative I/O line 129 is connected to a first terminal, the sense amplifier activation signal SAEN is inputted to a second terminal, and a positive data output signal DN (an output signal from the three-input NOR gate 145 which will be discussed below) is inputted to the third input terminal. The three-input NOR gate 144 outputs a negative data output signal DNN. Of the three input terminals of the three-input NOR gate 145, the positive I/O line 124 is connected to a first terminal, the sense amplifier activation signal SAEN is inputted to a second terminal, and the negative data output signal DNN is inputted to the third terminal. The three-input NOR gate 145 outputs the positive data output signal DN. The buffer 147 inputs the positive data output signal DN and outputs a sense amplifier output signal SAOUT. Note that the sense amplifier 148 is an example of a detector of the present invention.

Figure 2:
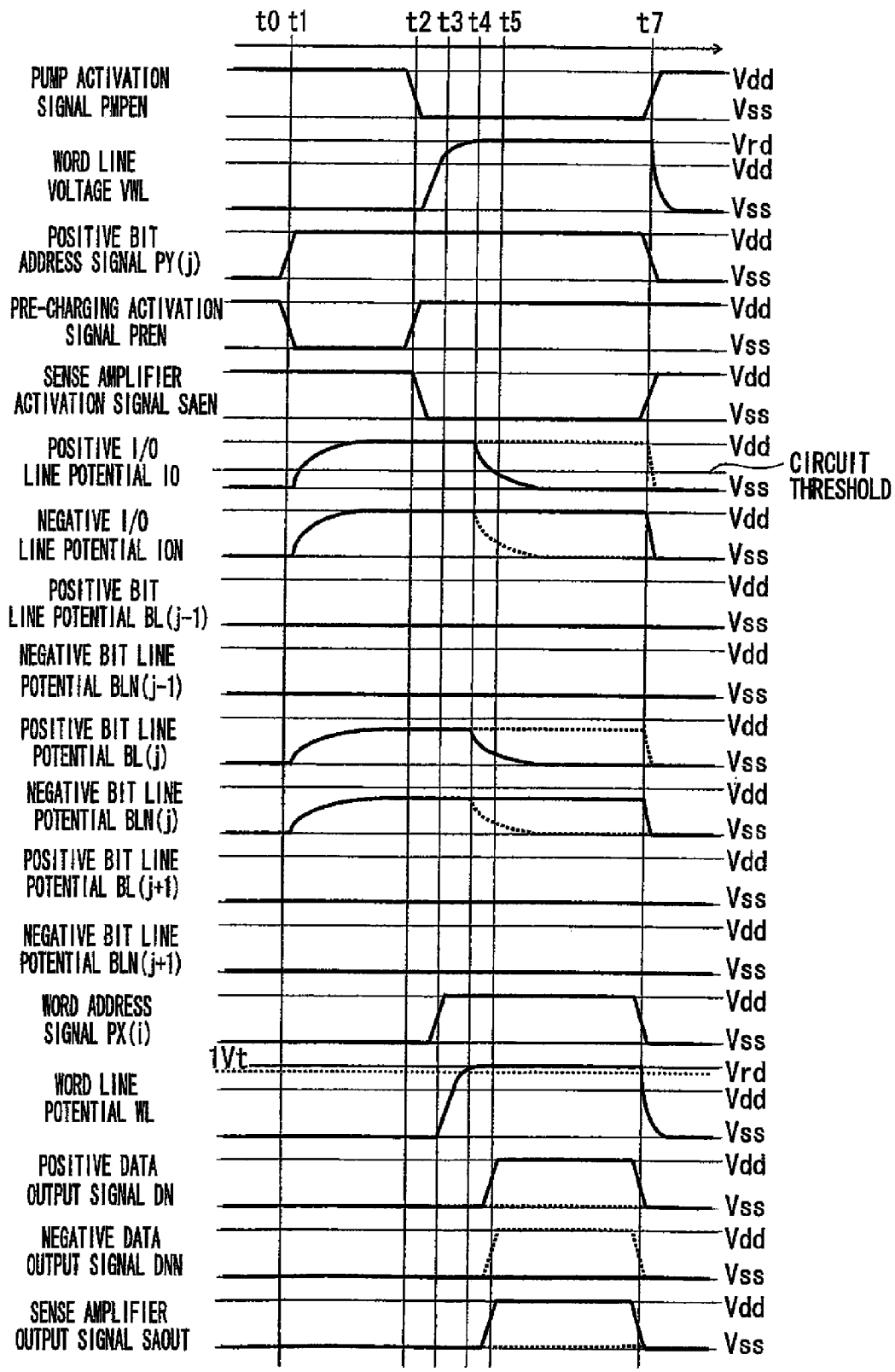
FIG. 2 is a timing chart for describing operations of the non-volatile semiconductor storage device relating to the first exemplary embodiment.

Now, as an operation of this first exemplary embodiment, an operation for reading of data which has been stored in the memory cell array 102 of the non-volatile semiconductor storage device 10 will be described with reference to FIG. 2. Herein, for the sake of simplicity, the individual source lines 109 of the source line group 110 are all fixed at the reference voltage Vss. In FIG. 2, the data-reading operation commences from a time t=t1, but prior to the description of the data-reading operation herebelow, operation of the non-volatile semiconductor storage device 10 in a period before the time t=t1 (a period in a standby state) will be described (i.e., at a time t=t0).

In the standby state period, the pump activation signal PMPEN is at the power supply voltage Vdd. Therefore, the word line voltage-raising circuit 113 at which the pump activation signal PMPEN is inputted is in an inactive condition in the standby state, and the reference voltage Vss is supplied to the word line voltage-raising circuit 113 as the word line voltage VWL. Further, in the standby state, the word address signals PX being propagated along the individual word address signal lines 114 of the word address signal line group 115 are all at the reference voltage Vss. Therefore, the individual word line drivers 116 of the word line driver group 117 are all in an non-selected (inactive) condition, and output the reference voltage Vss to the respective word lines 103 of the word line group 104 (i.e., potentials WL of the individual word lines 103 are all at the reference voltage Vss).

Furthermore, in the standby state, the positive bit address signals PY which are propagated along the individual positive bit address signal lines 118 of the positive bit address signal line group 119 are all at the reference voltage Vss. The levels of these positive bit address signals PY are each inverted by the respective inverter 122 of the inverter group 123, and thus negative bit address signals PYN which are propagated along the individual negative bit address signal lines 120 of the negative bit address signal line group 121 are all at the power supply voltage Vdd. Therefore, at each positive bit line selection gate 127 of the positive bit line selection gate group 128, the N-type transistor 125 is off and the N-type transistor 126 is on in the standby state. Because the positive bit lines 105 of the positive bit line group 106 are respectively connected to the reference voltage Vss by the turned-on N-type transistors 126, potentials BL of the individual positive bit lines 105 are all at the reference voltage Vss. Further, at each negative bit line selection gate 132 of the negative bit line selection gate group 133, similarly, the N-type transistor 130 is off and the N-type transistor 131 is on. Because the individual negative bit lines 107 of the negative bit line group 108 are respectively connected to the reference voltage Vss by the turned-on N-type transistors 131, potentials BLN of the individual negative bit lines 107 are also all at the reference voltage Vss.

Further yet, in the standby state, the sense amplifier activation signal SAEN and the pre-charging activation signal PREN are both at the power supply voltage Vdd, the P-type transistors 139 and 140 of the pre-charging circuit 141 are both off and the N-type transistors 137 and 138 are both on. Therefore, because the positive I/O line 124 is connected to the reference voltage Vss by the turned-on N-type transistor 137, a potential IO of the positive I/O line 124 is at the reference voltage Vss. Moreover, because the negative I/O line 129 is connected to the reference voltage Vss by the turned-on N-type transistor 138, the potential ION of the negative I/O line 129 is also at the reference voltage Vss. Furthermore, with the potential IO of the positive I/O line 124 and the potential ION of the negative I/O line 129 both being at the reference voltage Vss, in the sense amplifier 148 which is connected to the positive I/O line 124 and the negative I/O line 129, the positive data output signal DN, the negative data output signal DNN and the sense amplifier output signal SAOUT are all at the reference voltage Vss.

The operation for reading data stored in the memory cell array 102 is commenced by a pre-charging operation which charges up a positive bit line 105 and a negative bit line 107 being carried out from the time t=t1. That is, at the time t=t1, the pre-charging activation signal PREN changes to the reference voltage Vss. With this level change of the pre-charging activation signal PREN, the N-type transistors 137 and 138 of the pre-charging circuit 141 switch from on to off. Meanwhile, the P-type transistors 139 and 140 switch from off to on. The positive I/O line 124 is connected to the power supply voltage Vdd by the turned-on P-type transistor 139, and the negative I/O line 129 is connected to the power supply voltage Vdd by the turned-on P-type transistor 140.

Further, at the time t=t1, of the positive bit address signals PY which are propagated through the respective positive bit address signal lines 118 of the positive bit address signal line group 119, only a positive bit address signal PY(j) that is propagated along the particular positive bit address signal line 118 that corresponds to reading object memory cells 100 and 101 (i.e., is connected to the reading object memory cells 100 and 101) switches from the reference voltage Vss to the power supply voltage Vdd (i.e., the particular positive bit address signal line 118 which propagates the positive bit address signal PY(j) is selected). The level of this positive bit address signal PY(j) is inverted by the corresponding inverter 122 of the inverter group 123, and thus a negative bit address signal PYN(j) which is propagated along the particular negative bit address signal line 120 corresponding to the particular positive bit address signal line 118 is switched from the power supply voltage Vdd to the reference voltage Vss (not shown).

Accordingly, in the positive bit line selection gate group 128, at the positive bit line selection gate 127 that is connected to the selected positive bit address signal line 118 and negative bit address signal line 120, the N-type transistor 125 switches from off to on while the N-type transistor 126 switches from on to off. As a result, the positive bit line 105 connected to that positive bit line selection gate 127 is connected with the positive I/O line 124. Meanwhile, in the negative bit line selection gate group 133, at the negative bit line selection gate 132 that is connected to the selected positive bit address signal line 118 and negative bit address signal line 120, the N-type transistor 130 switches from off to on while the N-type transistor 131 switches from on to off. As a result, the negative bit line 107 connected to that negative bit line selection gate 132 is connected with the negative I/O line 129.

Accordingly, currents are supplied to the positive I/O line 124 and the negative I/O line 129 by the pre-charging circuit 141, and as shown for the positive I/O line potential IO, the negative I/O line potential ION, the positive bit line potential BL(j) and the negative bit line potential BLN(j) in FIG. 2, the positive I/O line 124 and the negative I/O line 129 are charged up to the power supply voltage Vdd, and the positive bit line 105 and negative bit line 107 corresponding to the reading object memory cells 100 and 101 (i.e., connected to the reading object memory cells 100 and 101) are charged up to Vdd-Vtn (Vtn being a threshold voltage Vt of the N-type transistors). Note that, here, of a line structured by the positive bit line 105 and positive I/O line 124 and a line structured by the negative bit line 107 and negative I/O line 129, one line corresponds to a first signal line and the other corresponds to a second signal line.

Meanwhile, positive bit address signals PY(x) which are propagated along the other positive bit address signal lines 118 (i.e., the positive bit address signal lines 118 apart from the particular positive bit address signal line 118 corresponding to the reading object memory cells 100 and 101) are kept at the reference voltage Vss. Therefore, negative bit address signals PYN(x) which are propagated along the other negative bit address signal lines 120 (i.e., the negative bit address signal lines 120 apart from the particular negative bit address signal line 120 corresponding to the particular positive bit address signal line 118) are kept at the reference voltage Vss. Accordingly, in the positive bit line selection gate group 128, at each of the positive bit line selection gates 127 that is connected to the other positive bit address signal lines 118 and the other negative bit address signal lines 120, the N-type transistor 125 is kept off and the N-type transistor 126 is kept on. Therefore, the other positive bit lines 105, which are connected to these positive bit line selection gates 127, are not connected with the positive I/O line 124. Furthermore, in the negative bit line selection gate group 133, at each of the negative bit line selection gates 132 that is connected to the other positive bit address signal lines 118 and the other negative bit address signal lines 120, the N-type transistor 130 is kept off and the N-type transistor 131 is kept on. Therefore, the other negative bit lines 107, which are connected to these negative bit line selection gates 132, are not connected with the negative I/O line 129.

Thus, as shown by positive bit line potentials BL(j−1), and BL(j+1) and negative bit line potentials BLN(j−1) and BLN (j+1) in FIG. 2, the potentials of the positive bit lines 105 and negative bit lines 107 that do not correspond to the reading object memory cells 100 and 101 (i.e., are not connected to the reading object memory cells 100 and 101) are kept at the reference voltage Vss. Therefore, in the positive bit line group 106 and negative bit line group 108 provided in the memory cell array 102, only the positive bit line 105 and negative bit line 107 corresponding to the reading object memory cells 100 and 101 are charged up, to Vdd-Vtn, via the positive I/O line 124 and the negative I/O line 129.

Then, because of the pre-charging operation in a period from t=t1 to t=t2, the potential IO of the positive I/O line 124 and the potential ION of the negative I/O line 129 reach the power supply voltage Vdd, and the potential BL(j) of the positive bit line 105 and the potential BLN(j) of the negative bit line 107, which correspond to the reading object memory cells 100 and 101, reach Vdd-Vtn. Thus, when the time reaches t=t2, the pre-charging operation of the positive bit line 105 and negative bit line 107 corresponding to the reading object memory cells 100 and 101 is completed, and a sense amplifier activation operation and a VWL pump activation operation are implemented.

That is, at the time t=t2, the pump activation signal PMPEN switches from the power supply voltage Vdd to the reference voltage Vss, and accordingly, the activated word line voltage-raising circuit 113 commences an operation of raising the word line voltage VWL. Hence, the word line voltage VWL starts to rise from the reference voltage Vss, and ultimately reaches a voltage Vrd (Vrd>Vdd; see FIG. 2). Furthermore, when the time is t=t2, the sense amplifier activation signal SAEN switches from the power supply voltage Vdd to the reference voltage Vss and the pre-charging activation signal PREN switches from the reference voltage Vss to the power supply voltage Vdd. As a result, the P-type transistors 139 and 140 of the pre-charging circuit 141 switch from on to off and the connections between the positive I/O line 124 and negative I/O line 129 and the power supply voltage Vdd are cut. Hence, the (pre-charging) current supplies to the positive I/O line 124 and negative I/O line 129 corresponding with the reading object memory cells 100 and 101 are stopped.

Further, because the sense amplifier activation signal SAEN is at the power supply voltage Vdd in the period with time t<t2, the positive data output signal DN from the three-input NOR gate 145 of the sense amplifier 148 and the negative data output signal DNN outputted from the three-input NOR gate 144 are unconditionally (i.e., regardless of the levels of the signals inputted through the other input terminals) at the reference voltage Vss. Then, when the time t=t2 and the sense amplifier activation signal SAEN switches from the power supply voltage Vdd to the reference voltage Vss, the positive data output signal DN and the negative data output signal DNN go into states which switch in accordance with the levels of the signals that are inputted through the other input terminals of the three-input NOR gates 145 and 144 (active states). Here, the potential IO of the positive I/O line 124 and the potential ION of the negative I/O line 129, which are inputted at the three-input NOR gates 145 and 144 of the sense amplifier 148, are at the power supply voltage Vdd because of the above-described pre-charging operation. Therefore, the positive data output signal DN and the negative data output signal DNN at the sense amplifier 148 stay at the reference voltage Vss, the same as in the period when the time t<t2, regardless of the change in level of the sense amplifier activation signal SAEN. Accordingly, the sense amplifier output signal SAOUT also stays at the reference voltage Vss.

Then, when the time reaches t=t3, a word line selection operation is implemented. That is, at the time t=t3, of the word address signals PX which are propagated through the respective word address signal lines 114 of the word address signal line group 115, only a word address signal PX(i) that is propagated along the particular word address signal line 114 that corresponds to the reading object memory cells 100 and 101 is selectively switched from the reference voltage Vss to the power supply voltage Vdd (i.e., the particular word address signal line 114 propagating the word address signal PX(i) is selected). Accordingly, in the word line driver group 117, the word line driver 116 that is connected to the selected word address signal line 114 supplies (outputs) the word line voltage VWL provided from the word line voltage-raising circuit 113 to the word line 103 connected to that word line driver 116 (i.e., the word line 103 that is connected to the reading object memory cells 100 and 101).

Because of the word line selection operation that is performed at the time t=t3, the potential WL of that word line 103 exceeds a voltage Vt, which is a threshold voltage of the reading object memory cells 100 and 101, at a time t=t4, as shown in FIG. 2, and ultimately rises to the voltage Vrd. Note that the rise of the potential WL of the word line 103 to which the reading object memory cells 100 and 101 are connected corresponds to input of a selection signal in the present invention. When the potential WL of the word line 103 exceeds the voltage Vt (i.e., at the time t=t4), an operation of reading data from the reading object memory cells 100 and 101 is implemented by the sense amplifier 148.

That is, data with opposite values have been written to the corresponding positive memory cell 100 and negative memory cell 101, and when the potential WL of the word line 103 exceeds the voltage Vt, the memory cell of the reading object memory cells 100 and 101 to which a data one (1) has been written turns on, and the memory cell to which a data zero (0) has been written stays off. For example, in a case in which data one has been written to the reading object positive memory cell 100 and data zero has been written to the reading object negative memory cell 101, the positive bit line 105 that is connected to the drain electrode of the turned-on reading object positive memory cell 100, and the positive I/O line 124 connected to that positive bit line 105, are discharged by an on-current flowing through the positive memory cell 100. Thus, the potential BL(j) of the positive bit line 105 and the potential IO of the positive I/O line 124 proceed to fall as shown by solid lines in FIG. 2, and will be at the reference voltage Vss when the discharging has finished. Meanwhile, an off-current flowing through the reading object negative memory cell 101 which has stayed off is very small. Therefore, the negative bit line 107 that is connected to the drain electrode of the staying-off negative memory cell 101, and the negative I/O line 129 connected to that negative bit line 107, are not discharged. Accordingly, as shown by the solid lines in FIG. 2, the potential BLN(j) of the negative bit line 107 stays at the voltage Vdd-Vtn, and the potential ION of the negative I/O line 129 is held at the power supply voltage Vdd.

On the other hand, a case in which, for example, data zero has been written to the reading object positive memory cell 100 and data one has been written to the reading object negative memory cell 101, the negative bit line 107 that is connected to the drain electrode of the turned-on reading object negative memory cell 101, and the negative I/O line 129 connected to that negative bit line 107, are discharged by an on-current flowing through the negative memory cell 101. Thus, the potential BLN(j) of the negative bit line 107 and the potential IO of the negative I/O line 129 proceed to fall as shown by broken lines in FIG. 2, and will be at the reference voltage Vss when the discharging has finished. Meanwhile, an off-current flowing through the reading object positive memory cell 100 which has stayed off is very small. Therefore, the positive bit line 105 that is connected to the drain electrode of the staying-off positive memory cell 100, and the positive I/O line 124 connected to that positive bit line 105, are not discharged. Accordingly, as shown by the broken lines in FIG. 2, the potential BL(j) of the positive bit line 105 stays at the voltage Vdd-Vtn, and the potential IO of the positive I/O line 124 is held at the power supply voltage Vdd.

Thus, in this first exemplary embodiment, data of opposite values is written to a corresponding positive memory cell 100 and negative memory cell 101 beforehand. The potential BL(j) of the positive bit line 105 that is connected to the reading object positive memory cell 100 and the potential BLN(j) of the negative bit line 107 that is connected to the reading object negative memory cell 101 are both charged up to Vdd-Vtn, and the potential IO of the positive I/O line 124 connected to the positive bit line 105 and the potential ION of the negative I/O line 129 connected to the negative bit line 107 are both charged up to Vdd. Thereafter, when the potential WL of the word line 103 that is connected to both of the memory cells 100 and 101 is made larger than the threshold voltage Vt of the memory cells 100 and 101, the one of the memory cells 100 and 101 to which a data one was written is turned on. Consequently, the potentials BL(j) and BLN(j) of the bit lines 105 and 107 and the potentials 10 and ION of the I/O lines 124 and 129 exhibit changes corresponding to time-integrals of currents flowing through the corresponding (connected) memory cells (an on-current and an off-current). Therefore, even if a difference between the on-current and the off-current of the reading object memory cells 100 and 101 is small in accordance with a reduction of an operating voltage of the non-volatile semiconductor storage device 10 (i.e., the power supply voltage Vdd), after a certain amount of time has passed from the time (the time t=t4) at which the potential WL of the word line 103 exceeded the voltage Vt and the one of the reading object memory cells 100 and 101 turned on (i.e., for example, when the time reaches t=t5), the potential IO of the positive I/O line 124 that is connected to the positive memory cell 100 via the positive bit line 105 and the potential ION of the negative I/O line 129 that is connected to the negative memory cell 101 via the negative bit line 107 exhibit a large difference (that is, the potentials of only the bit line and I/O line that are connected to the memory cell that turned on have fallen significantly).

Then, when the time t=t5 and the one of the potential IO of the positive I/O line 124 and the potential ION of the negative I/O line 129 falls below a circuit threshold of the sense amplifier 148, the data that were written to the reading object memory cells 100 and 101 are latched in the sense amplifier 148. That is, for example, in the case in which data one was written to the positive memory cell 100 of the reading object memory cells 100 and 101, at the time t=t5, as shown by the solid lines in FIG. 2, only the potential IO of the positive I/O line 124 will have fallen below the circuit threshold of the sense amplifier 148. Therefore, as shown by a solid line in FIG. 2, the positive data output signal DN which is outputted from the three-input NOR gate 145 switches to the power supply voltage Vdd. Meanwhile, as shown by a solid line in FIG. 2, the negative data output signal DNN which is outputted from the three-input NOR gate 144 is kept at the reference voltage Vss. Thus, the data which have been read from the reading object memory cells 100 and 101 are latched at a latch circuit constituted by the three-input NOR gates 145 and 144. The sense amplifier output signal SAOUT is also at the power supply voltage Vdd, and the datum that has been read out is outputted as the sense amplifier output signal SAOUT.

On the other hand, for example, in the case in which data zero was written to the positive memory cell 100 of the reading object memory cells 100 and 101, at the time t=t5, as shown by the broken lines in FIG. 2, only the potential ION of the negative I/O line 129 will have fallen below the circuit threshold of the sense amplifier 148. Therefore, as shown by a broken line in FIG. 2, the negative data output signal DNN which is outputted from the three-input NOR gate 144 switches to the power supply voltage Vdd. Meanwhile, as shown by a broken line in FIG. 2, the positive data output signal DN which is outputted from the three-input NOR gate 145 is kept at the reference voltage Vss. Thus, the data which have been read from the reading object memory cells 100 and 101 are latched at the latch circuit constituted by the three-input NOR gates 145 and 144. The sense amplifier output signal SAOUT is also at the reference voltage Vss, and the datum that has been read out is outputted as the sense amplifier output signal SAOUT.

Then, when the time reaches t=t7, the data-reading operation ends. That is, when the time is t=t7, the pump activation signal PMPEN switches from the reference voltage Vss to the power supply voltage Vdd. As a result, the word line voltage-raising circuit 113 goes into an inactive condition, the word line voltage VWL falls toward the reference voltage Vss, and the word address signals PX which are propagated along all the word address signal lines 114 of the word address signal line group 115 (including the word address signal PX(i) which is propagated along the particular word address signal line 114 corresponding to the reading object memory cells 100 and 101) are at the reference voltage Vss. Thus, of the reading object memory cells 100 and 101, the memory cell to which the data one had been written, and which has been turned on, turns off.

Furthermore, when the time is t=t7, the positive bit address signals PY which are propagated along all the positive bit address signal lines 118 of the positive bit address signal line group 119 (including the positive bit address signal PY(j) which is propagated along the particular positive bit address signal line 118 corresponding to the reading object memory cells 100 and 101) are at the reference voltage Vss. Accordingly, the negative bit address signals PYN which are propagated along all the negative bit address signal lines 120 of the negative bit address signal line group 121 (including the negative bit address signal PYN(j) which is propagated along the particular negative bit address signal line 120 corresponding to the particular positive bit address signal line 118) are at the power supply voltage Vdd.

As a result, in every positive bit line selection gate 127 of the positive bit line selection gate group 128, the N-type transistor 125 turns off and the N-type transistor 126 turns on, and the positive bit line 105 that is connected with the reading object positive memory cell 100 is cut off from the positive I/O line 124 and connected to the reference voltage Vss. Therefore, the potential BL(j) of that positive bit line 105 goes to the reference voltage Vss (i.e., is discharged). Meanwhile, in every negative bit line selection gate 132 of the negative bit line selection gate group 133 too, the N-type transistor 130 turns off and the N-type transistor 131 turns on, and the negative bit line 107 that is connected to the reading object negative memory cell 101 is cut off from the negative I/O line 129 and connected to the reference voltage Vss. Therefore, the potential BLN(j) of that negative bit line 107 goes to the reference voltage Vss (i.e., is discharged).

Furthermore, when the time is t=t7, the sense amplifier activation signal SAEN switches to the power supply voltage Vdd, and the N-type transistors 137 and 138 of the pre-charging circuit 141 both turn on. The positive I/O line 124 is connected to the reference voltage Vss by the turned-on N-type transistor 137, and the potential IO of the positive I/O line 124 goes to the reference voltage Vss (i.e., is discharged). Meanwhile, the P-type transistor 139 is connected to the reference voltage Vss by the turned-on N-type transistor 138, and the potential ION of the negative I/O line 129 goes to the reference voltage Vss (i.e., is discharged). Furthermore, in accordance with the potential IO of the positive I/O line 124 and the potential ION of the negative I/O line 129 respectively reaching the reference voltage Vss, the positive data output signal DN, the negative data output signal DNN and the sense amplifier output signal SAOUT all go to the reference voltage Vss. Thus, the non-volatile semiconductor storage device 10 is returned to the standby state by the above operation.

Thus, according to this first exemplary embodiment, data of opposite values are written to the corresponding positive memory cell 100 and negative memory cell 101 in advance. At a time of reading of the data, time-integrals of currents flowing through the respective memory cells are converted to potentials in the bit lines (and I/O lines) connected to the respective memory cells, and as time passes, the potential of the I/O line connected to one of the memory cells falls below a predetermined value, and the respective potentials of the I/O lines at this point in time are retained to serve as reading data. Consequently, effects of variations in Vt values of memory cells, variations in operating voltage bands of transistors and suchlike are eliminated, and more stable low-voltage reading operations can be realized.

Moreover, the memory cell array 102 relating to the exemplary embodiment is divided into a region of arrangement of the positive memory cells 100 and a region of arrangement of the negative memory cells 101 in the memory cell array 102. For each pair of a positive memory cell 100 and a negative memory cell 101 which are correspondingly provided in the memory cell array 102, between the positive bit line 105 connected to the reading object positive memory cell 100 and the negative bit line 107 connected to the reading object negative memory cell 101, plural bit lines which are respectively connected to other memory cells are disposed in the memory cell array 102. Accordingly, the plurality of bit lines connected with other memory cells that are disposed between the bit lines 105 and 107 connected to the reading object memory cells 100 and 101 are utilized as shield lines. Therefore, even when, of the bit lines 105 and 107 connected to the reading object memory cells 100 and 101, the potential of only the bit line that is connected to a memory cell that is turned on falls significantly, occurrences of misreading of data and the like due to the currents (voltage changes) that flow through the bit lines 105 and 107 interfering with one another and the voltages (potentials) varying can be prevented.

Further, in the present embodiment, the potential WL of the word line 103 that is connected to the reading object memory cells 100 and 101 is raised by the word line selection operation at a time of data-reading from the memory cell array 102, and the raised potential WL is also supplied to the gate electrodes of the other memory cells 100 and 101 that are connected to the same word line 103 as the reading object memory cells 100 and 101. However, in the present embodiment, the positive bit lines 105 and negative bit lines 107 of the positive bit line group 106 and negative bit line group 108 that do not correspond to the reading object memory cells 100 and 101 are not connected with the positive I/O line 124 and the negative I/O line 129 during the data-reading operation, and potentials thereof are kept at the reference voltage Vss. Therefore, even though the raised potential WL is supplied by the word line selection operation to the gate electrodes of the other memory cells 100 and 101 which are connected to the same word line 103 as the reading object memory cells 100 and 101, unwanted on-currents and off-currents (discharging currents) can be prevented from flowing in these other memory cells 100 and 101. Accordingly, current consumption (power consumption) during reading of data from the memory cell array 102 can be reduced.

Second Exemplary Embodiment

Figure 3:
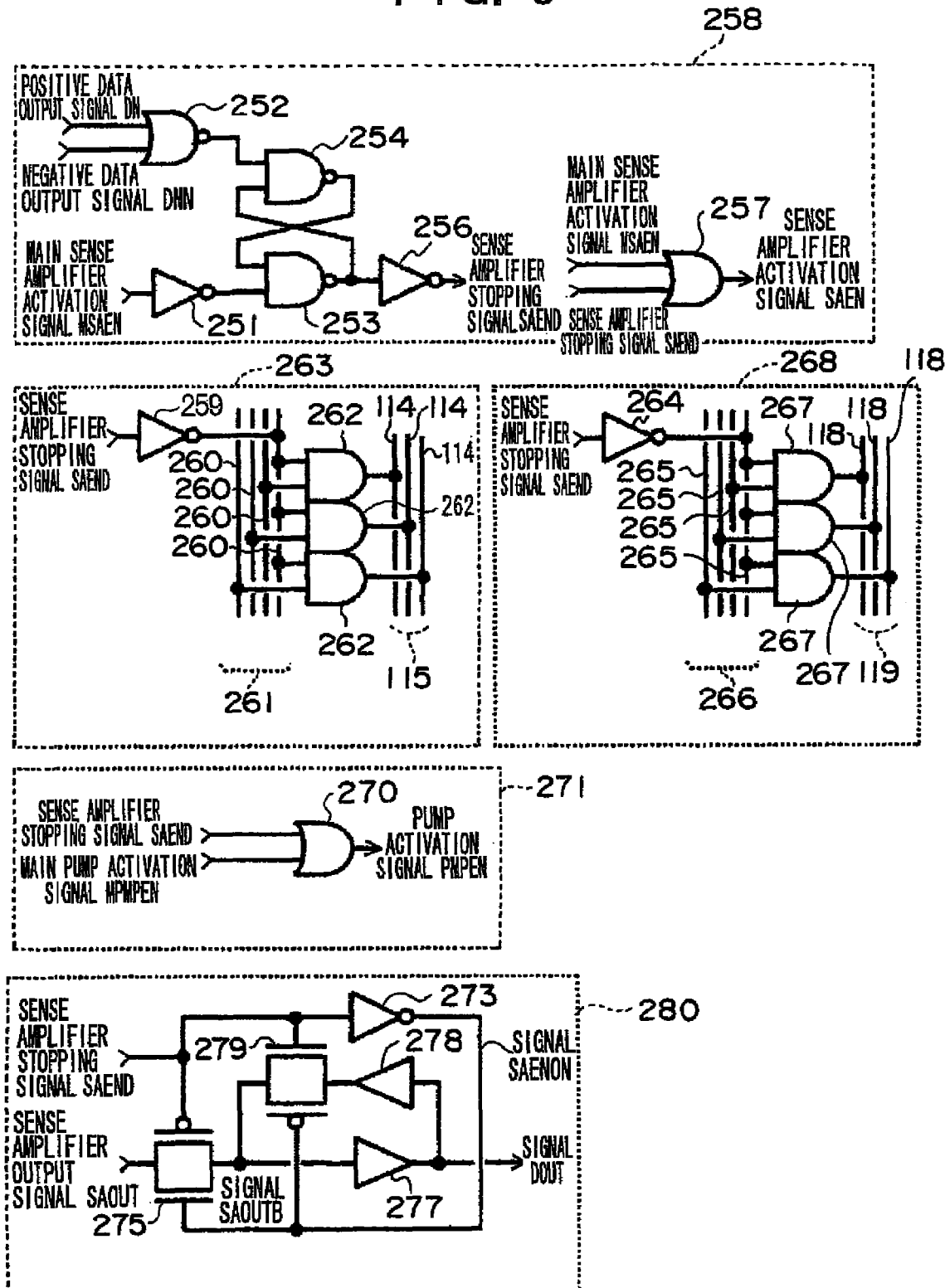
FIG. 3 is circuit diagrams of portions additional to the device of FIG. 1 in a semiconductor storage device relating to a second exemplary embodiment.

Next, a second exemplary embodiment of the present invention will be described. Herein, portions that are the same as in the first exemplary embodiment are assigned the same reference numerals, and descriptions thereof will not be given. A non-volatile semiconductor storage device relating to this second exemplary embodiment is structured with, as shown in FIG. 3, a sense amplifier control circuit 258, a word address control circuit 263, a bit address control circuit 268, a pump activation signal control circuit 271 and a data latching circuit 280 being respectively added to the structure of the non-volatile semiconductor storage device 10 described for the first exemplary embodiment, with the objective of further reducing power consumption at times of data reading from the flash memory.

The sense amplifier control circuit 258 is structured with an inverter 251, at which a main sense amplifier activation signal MSAEN is inputted, a two-input NOR gate 252, a two-input NAND gate 253, a two-input NAND gate 254, an inverter 256 and a two-input OR gate 257. The positive data output signal DN and negative data output signal DNN generated by the sense amplifier 148 are each inputted to the two-input NOR gate 252. One of the two input terminals of the two-input NAND gate 253 is connected to the output terminal of the inverter 251. One of the two input terminals of the two-input NAND gate 254 is connected to the output terminal of the two-input NOR gate 252 and the other is connected to the output terminal of the two-input NAND gate 253, and the output terminal of the two-input NAND gate 254 is connected to the other of the two input terminals of the two-input NAND gate 253. The input terminal of the inverter 256 is connected to the output terminal of the two-input NAND gate 253, and the inverter 256 outputs a sense amplifier stopping signal SAEND. The main sense amplifier activation signal MSAEN is inputted to one of the two input terminals of the two-input OR gate 257 and the sense amplifier stopping signal SAEND is inputted to the other, and the two-input OR gate 257 outputs the sense amplifier activation signal SAEN.

Further, in the non-volatile semiconductor storage device relating to this second exemplary embodiment, a main word address signal line group 261 is provided, which is constituted with main word address signal lines 260 in the same number as the word address signal lines 114 and propagates main word address signals MPX. The word address control circuit 263 is structured with an inverter 259, at which the sense amplifier stopping signal SAEND is inputted, and two-input AND gates 262, which are provided in the same number as the main word address lines 260. Ones of the two input terminals of each two-input AND gate 262 are all connected to the output terminal of the inverter 259, the others of the respective input terminals are connected to mutually different main word address signal lines 260 of the main word address signal line group 261, and the output terminals are respectively connected to mutually different word address signal lines 114 of the word address signal line group 115.

Further, in the non-volatile semiconductor storage device relating to this second exemplary embodiment, a main bit address signal line group 266 is provided, which is constituted with main bit address signal lines 265 in the same number as the positive bit address signal lines 118 and propagates main bit address signals MPY. The bit address control circuit 268 is structured with an inverter 264, to which the sense amplifier stopping signal SAEND is inputted, and two-input AND gates 267, which are provided in the same number as the main bit address signal lines 265. Ones of the two input terminals of each two-input AND gate 267 are all connected to the output terminal of the inverter 264, others of the respective input terminals are connected to mutually differing main bit address signal lines 265 of the main bit address signal line group 266, and the output terminals are respectively connected to mutually different positive bit address signal lines 118 of the positive bit address signal line group 119.

The pump activation signal control circuit 271 is structured with a two-input OR gate 270, which respectively inputs a main pump activation signal MPMPEN and the sense amplifier stopping signal SAEND, and outputs the pump activation signal PMPEN.

The data latching circuit 280 is structured with an inverter 273, a transfer gate 275, a buffer 277, a buffer 278 and a transfer gate 279. The inverter 273 inputs the sense amplifier stopping signal SAEND and outputs a signal SAENDN. The transfer gate 275 inputs the sense amplifier stopping signal SAEND as a P gate input, inputs the signal SAENDN as an N gate input, inputs the sense amplifier output signal SAOUT as a common input, and outputs a signal SAOUTB. The buffer 277 inputs the signal SAOUTB and outputs a signal DOUT. The buffer 278 inputs the signal DOUT and outputs a signal DOUT. The transfer gate 279 inputs the signal SAENDN as a P gate input, inputs the sense amplifier stopping signal SAEND as an N gate input, inputs the signal DOUT as a common input, and outputs the signal SAOUTB.

Note that the above-described sense amplifier control circuit 258, word address control circuit 263, bit address control circuit 268 and pump activation signal control circuit 271 correspond to an operation-stopping controller, and the data latching circuit 280 corresponds to a latching section in the present invention.

Figure 4:
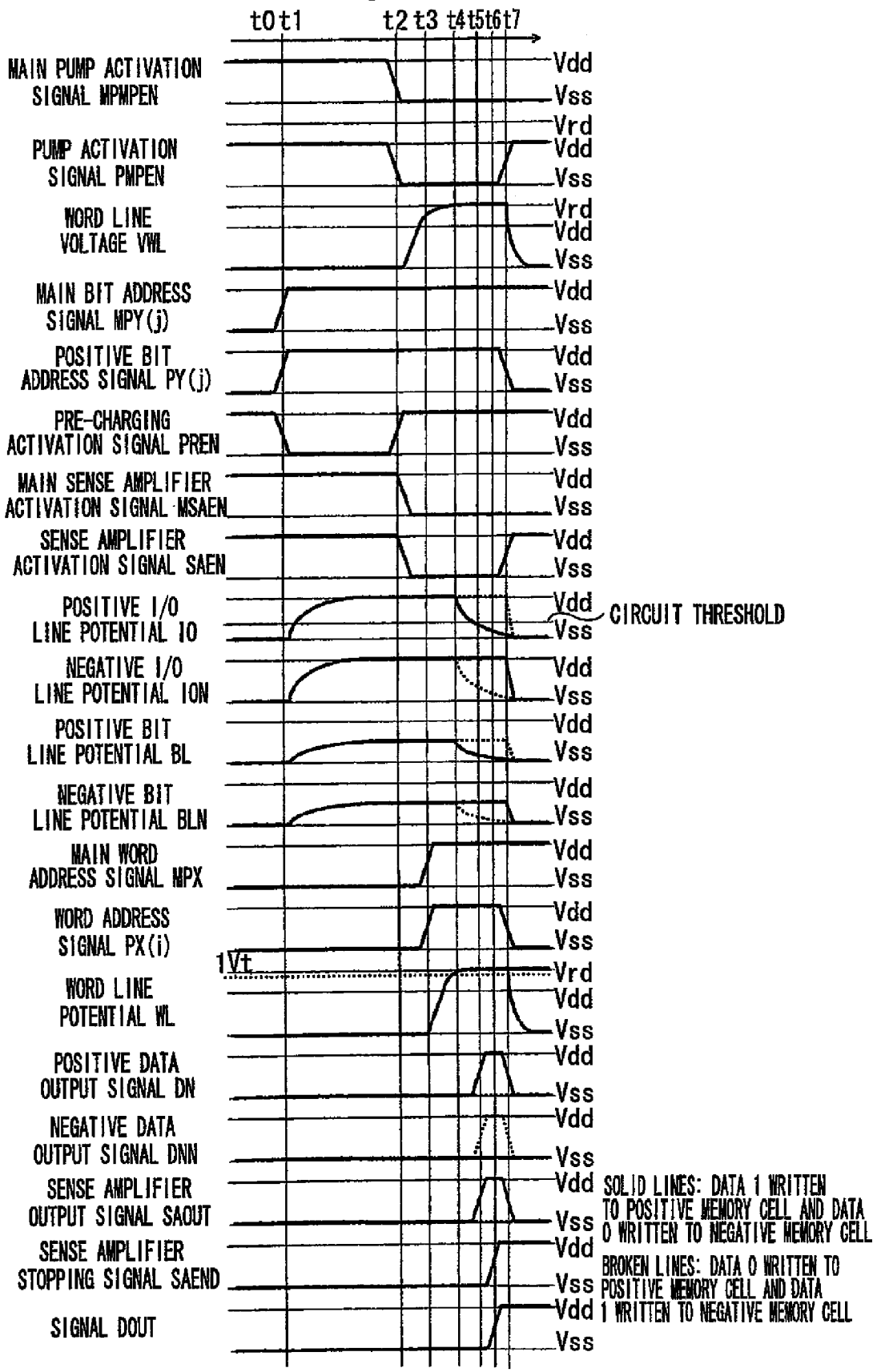
FIG. 4 is a timing chart for describing operations of the non-volatile semiconductor storage device relating to the second exemplary embodiment.
Figure 5:
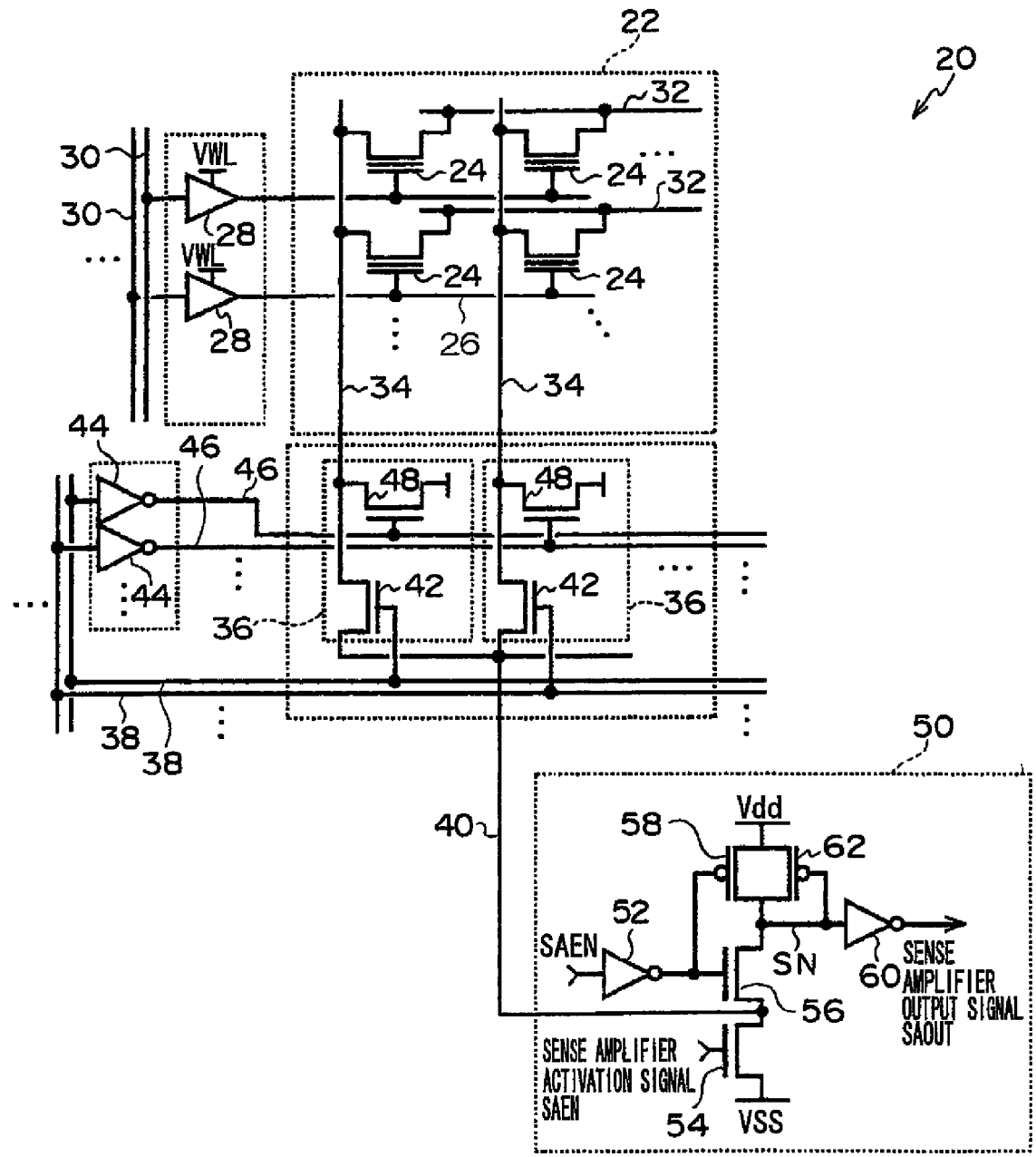
FIG. 5 is a circuit diagram showing an example of structure of a conventional flash memory storage device.

Next, a data-reading operation for the non-volatile semiconductor storage device relating to this second exemplary embodiment will be described with reference to FIG. 4. Only portions that differ from the first exemplary embodiment will be described.

In the non-volatile semiconductor storage device relating to this second exemplary embodiment, in the standby state before the time t=t1 (at the time t=t0), the main pump activation signal MPMPEN and the main sense amplifier activation signal MSAEN are at the power supply voltage Vdd. Meanwhile, the main word address signals MPX which are propagated along each of the main word address lines 260 of the main word address signal line group 261 are all at the reference voltage Vss, and the main bit address signals MPY which are propagated along each of the main bit address signal lines 265 of the main bit address signal line group 266 are all at the reference voltage Vss.

As described for the first exemplary embodiment, the positive data output signal DN and negative data output signal DNN which are outputted from the sense amplifier 148 are both at the reference voltage Vss in the standby state. Therefore, a flip-flop structured by the two-input NAND gates 253 and 254 of the sense amplifier control circuit 258 is reset, and the inverter 256 outputs the reference voltage Vss as the sense amplifier stopping signal SAEND. Meanwhile, at the two-input OR gate 257, which functions as a buffer, the sense amplifier stopping signal SAEND is at the reference voltage Vss while the main sense amplifier activation signal MSAEN is at the power supply voltage Vdd. Therefore, the power supply voltage Vdd is outputted as the sense amplifier activation signal SAEN.

Further, in the standby state, because the main word address signals MPX which are propagated along the individual main word address lines 260 of the main word address signal line group 261 are all at the reference voltage Vss as mentioned above, the two-input AND gates 262 of the word address control circuit 263 respectively output the reference voltage Vss as the word address signals PX to the individual word address signal lines 114 of the word address signal line group 115.

Further, in the standby state, the main bit address signals MPY which are propagated along the main bit address signal lines 265 of the main bit address signal line group 266 are all at the reference voltage Vss as mentioned above. Therefore, the two-input AND gates 267 of the bit address control circuit 268 respectively output the reference voltage Vss as the positive bit address signals PY to the individual positive bit address signal lines 118 of the positive bit address signal line group 119.

Furthermore, in the standby state, the sense amplifier stopping signal SAEND is at the reference voltage Vss while the main pump activation signal MPMPEN is at the power supply voltage Vdd. Therefore, the two-input OR gate 270 of the pump activation signal control circuit 271 outputs the power supply voltage Vdd as the pump activation signal PMPEN.

Further yet, in the standby state, the sense amplifier stopping signal SAEND is at the reference voltage Vss, and as described for the first exemplary embodiment, the sense amplifier output signal SAOUT is also at the reference voltage Vss. Therefore, at the data latching circuit 280, the transfer gate 275 is on and the transfer gate 279 is off, the data latching circuit 280 outputs the sense amplifier output signal SAOUT, that is inputted, as the signal DOUT, and the signal DOUT is at the reference voltage Vss.

In the non-volatile semiconductor storage device relating to this second exemplary embodiment, further details of the standby state are as described for the first exemplary embodiment.

At a time of commencement of the data-reading operation at the time t=t1, the pre-charging activation signal PREN is altered to the reference voltage Vss. Further, of the main bit address signals MPY which are propagated along each of the main bit address signal lines 265 of the main bit address signal line group 266, only the main bit address signal MPY(j) that propagates through the particular main bit address signal line 265 that corresponds to the reading object memory cells 100 and 101 is switched from the reference voltage Vss to the power supply voltage Vdd (i.e., the particular main bit address signal line 265 that propagates the main bit address signal MPY(j) is selected).

At the time t=t1, the sense amplifier stopping signal SAEND is held at the reference voltage Vss. Therefore, of the plurality of two-input AND gates 267 in the bit address control circuit 268, the particular two-input AND gate 267 connected to the main bit address signal line 265 that has been selected outputs the power supply voltage Vdd to the positive bit address signal line 118 connected thereto (i.e., the positive bit address signal line 118 corresponding to the main bit address signal line 265 that has been selected) as the main bit address signal PY(j).

Further, at the time t=t1, in accordance with the pre-charging activation signal PREN changing to the reference voltage Vss, the positive I/O line 124 and the negative I/O line 129 are charged up to the power supply voltage Vdd, and the pre-charging operation which charges up the positive bit line 105 and negative bit line 107 connected to the reading object memory cells 100 and 101 to Vdd-Vtn is performed as described for the first exemplary embodiment.

At the time t=t2, the pre-charging activation signal PREN switches from the reference voltage Vss to the power supply voltage Vdd and the pre-charging operation stops as described for the first exemplary embodiment. Further, at the time t=t2, the main sense amplifier activation signal MSAEN switches from the power supply voltage Vdd to the reference voltage Vss and the resetting of the flip-flop constituted by the two-input NAND gates 253 and 254 in the sense amplifier control circuit 258 is released. However, at the time t=t2, the positive data output signal DN and the negative data output signal DNN outputted from the sense amplifier 148 are kept at the reference voltage Vss. Therefore, the sense amplifier stopping signal SAEND which is outputted from the inverter 256 is also kept at the reference voltage Vss. Furthermore, because the main sense amplifier activation signal MSAEN switches from the power supply voltage Vdd to the reference voltage Vss while the sense amplifier stopping signal SAEND is kept at the reference voltage Vss, the sense amplifier activation signal SAEN which is outputted from the two-input OR gate 257 switches from the power supply voltage Vdd to the reference voltage Vss.

Further yet at the time t=t2, the main pump activation signal MPMPEN switches from the power supply voltage Vdd to the reference voltage Vss and, as mentioned above, the sense amplifier stopping signal SAEND is held at the reference voltage Vss. Therefore, the pump activation signal PMPEN outputted by the two-input OR gate 270 of the pump activation signal control circuit 271 switches from the power supply voltage Vdd to the reference voltage Vss. Here, implementation of the operation for activation of the sense amplifier 148 and the VWL pump activation operation at the time t=t2 are as described for the first exemplary embodiment.

At the time t=t3, of the main word address signals MPX which are propagated along each of the main word address lines 260 of the main word address signal line group 261, only a main word address signal MPX(i) that is propagated along the particular main word address line 260 that corresponds to the reading object memory cells 100 and 101 switches from the reference voltage Vss to the power supply voltage Vdd (i.e., the particular main word address line 260 propagating the main word address signal MPX(i) is selected).

The sense amplifier stopping signal SAEND is still kept at the reference voltage Vss at the time t=t3, and of the plurality of two-input AND gates 262 of the word address control circuit 263, the particular two-input AND gate 262 that is connected to the selected main word address line 260 outputs the power supply voltage Vdd to the word address signal line 114 connected thereto (i.e., the word address signal line 114 corresponding to the main word address line 260 that has been selected) as the word address signal PX(i). Herein, the word address selection operation at the time t=t3 is as described for the first exemplary embodiment.

Then, at the time t=t4, the operation for reading data from the reading object memory cells 100 and 101 with the sense amplifier 148 is implemented in the same manner as in the first exemplary embodiment.

Then, at the time t=t5, as described for the first exemplary embodiment, the potential IO of the positive I/O line 124 or the potential ION of the negative I/O line 129 falls below the circuit threshold of the sense amplifier 148, and the reading data are latched in the latching circuit structured by the three-input NOR gates 145 and 144 of the sense amplifier 148. In the case in which data one was written to the positive memory cell 100 (and data zero to the negative memory cell 101), the positive data output signal DN is at the power supply voltage Vdd, the negative data output signal DNN is at the reference voltage Vss, and the sense amplifier output signal SAOUT is at the power supply voltage Vdd. In the case in which data zero was written to the positive memory cell 100 (and data one to the negative memory cell 101), the positive data output signal DN is at the reference voltage Vss, the negative data output signal DNN is at the power supply voltage Vdd, and the sense amplifier output signal SAOUT is at the reference voltage Vss.

Now, when the positive data output signal DN or the negative data output signal DNN switches from the reference voltage Vss to the power supply voltage Vdd as described above, the switching of the positive data output signal DN or negative data output signal DNN from the reference voltage Vss to the power supply voltage Vdd is stored at the flip-flop structured by the two-input NAND gates 253 and 254 of the sense amplifier control circuit 258. At the time t=t6, the sense amplifier stopping signal SAEND which is outputted from the inverter 256 switches from the reference voltage Vss to the power supply voltage Vdd, and the sense amplifier activation signal SAEN outputted from the two-input OR gate 257 switches from the reference voltage Vss to the power supply voltage Vdd.

At the data latching circuit 280, in accordance with the sense amplifier stopping signal SAEND switching from the reference voltage Vss to the power supply voltage Vdd, the transfer gate 275 turns off and the transfer gate 279 turns on, and the sense amplifier output signal SAOUT which was inputted therebefore is latched as the datum (i.e., the signal DOUT).

Meanwhile, at the word address control circuit 263, in accordance with the sense amplifier stopping signal SAEND switching from the reference voltage Vss to the power supply voltage Vdd, the word address signals PX which are outputted from the individual two-input AND gates 262 to the individual word address signal lines 114 of the word address signal line group 115 all go to the reference voltage Vss. Similarly, at the bit address control circuit 268, the bit address signals PY which are outputted from the respective two-input AND gates 267 to the respective positive bit address signal lines 118 of the positive bit address signal line group 119 all go to the reference voltage Vss. Further, at the pump activation signal control circuit 271, in accordance with the sense amplifier stopping signal SAEND switching from the reference voltage Vss to the power supply voltage Vdd, at the time t=t7, the pump activation signal PMPEN outputted from the two-input OR gate 270 switches to the power supply voltage Vdd, and stops the operation by the word line voltage-raising circuit 113 for raising the word line potential VWL.

Thus, in this second exemplary embodiment, in accordance with the data-reading operation from the reading object memory cells 100 and 101, the switching of the positive data output signal DN or the negative data output signal DNN from the reference voltage Vss to the power supply voltage Vdd is a trigger for returning the various sections of the non-volatile semiconductor storage device to the standby state. Consequently, in comparison with the non-volatile semiconductor storage device 10 described for the first exemplary embodiment, current consumption (power consumption) when reading data from the memory cell array 102 can be further reduced.

Anyway, in the above descriptions, it has been described that the memory cell array 102 is structured with flash memory serving as the non-volatile storage section relating to the present embodiment. However, the present invention is not limited thus. Other non-volatile memories in which memory cells switch on and off in accordance with data that has been written may be employed.

Furthermore, a mode has been described in which the bit lines 105 and 107 and the source lines 109 are all set to the reference voltage Vss in the standby state, and the bit lines 105 and 107 that are connected to the reading object memory cells 100 and 101 are charged up. However, the present invention is not limited thus. For example, a reading system is also applicable in which the bit lines 105 and 107 and the source lines 109 are set to the power supply voltage Vdd in the standby state, and the source line 109 that is connected to the reading object memory cells 100 and 101 is selectively set to the reference voltage Vss at the time of a reading operation.

Further, the word line address signals PX and bit line address signals PY are not limited to the signal arrangements and signal numbers described above, but obviously can be suitably modified within a scope not departing from the present invention.

Further, the above-described word line drivers 28, bit line selection gates 127 and 132, word line voltage-raising circuit 113, pre-charging circuit 141, sense amplifier 148, sense amplifier control circuit 258, word address control circuit 263, bit address control circuit 268, pump activation signal control circuit 271 and data latching circuit 280 are all merely examples of circuit structures, and obviously can be suitably modified within a scope not departing from the present invention.

Further, in the above descriptions, the memory cell array 102 which has been described is an example of the semiconductor storage section relating to the present invention and has a structure which is divided into a region of arrangement of the positive memory cell 100 and a region of arrangement of the negative memory cell 101, and in which respective pluralities of bit lines connected to other memory cells are arranged in the memory cell array 102 between the positive bit line 105 connected to a positive memory cell 100 and the negative bit line 107 connected to the corresponding negative memory cell 101. However, the present invention is not limited thus. A memory cell array with a structure in which a positive bit line connected to a positive memory cell and a negative bit line connected to a corresponding negative memory cell are adjacent to one another in the memory cell array may be employed. However, in order to prevent interference of currents (voltage changes) that flow along the positive bit line and the negative bit line during data reading, it is desirable for a memory cell array to have a structure in which individual memory cells and individual bit lines are arranged such that bit lines connected to other memory cells are disposed between the positive bit line connected to a positive memory cell and the negative bit line connected to the corresponding negative memory cell.

What is claimed is:

1. A semiconductor memory device comprising:
   a plurality of memory cells arranged in rows and columns, memory cells in a predetermined column being divided into a first group and a second group of memory cells;
   a first signal line which is connectable to the first group of memory cells and which receives data stored in associated memory cells; and
   a second signal line which is connectable to the second group of memory cells and which receives data stored in associated memory cells,
   wherein memory cells in the first group of memory cells store a first type of data and memory cells in the second group of memory cells store a second type of data having mutually opposite values with respect to the first type of data.

2. The semiconductor memory device according to claim 1, further comprising:
   a sense amplifier which receives the data received by the first and second signal lines and which outputs data recognized as data that is stored in the semiconductor memory device.

3. The semiconductor memory device according to claim 1, wherein the first and second types of data have mutually opposite logic level values.

4. The semiconductor memory device according to claim 1, wherein the first type of data has a positive value and the second type of data is zero.

5. A semiconductor memory device comprising:
   a plurality of memory cells arranged in rows and columns, memory cells in a predetermined column being divided into a first group and a second group of memory cells, memory cells in each row being coupled to a corresponding word line, and memory cells in each column being coupled to a corresponding bit line;
   a first signal line which is connectable to bit lines of memory cells in the first group and which receives data stored in associated memory cells; and
   a second signal line which is connectable to bit lines of memory cells in the second group and which receives data stored in associated memory cells,
   wherein the memory cells in the first group and memory cells in the second group associated with the memory cells of the first group form pairs of memory cells and each of the pairs of memory cells stores two sets of data having mutually opposite values.

6. The semiconductor memory device according to claim 5, further comprising:
   a sense amplifier which receives the complementary data received by the first and second signal lines and which outputs data recognized as data stored in the semiconductor memory device.

7. The semiconductor memory device according to claim 5, wherein the complementary data have mutually opposite logic level values.

8. The semiconductor memory device according to claim 5, wherein one memory cell of the respective pairs of memory cells stores a positive value and the other memory cell of the respective pairs of memory cells stores zero value.

9. A semiconductor memory device comprising:
   a plurality of pairs of memory cells arranged in rows and columns, the memory cells being divided into a first group and a second group of memory cells, one memory cell of the respective pairs of memory cells belonging to the first group and the other memory cell of the respective pairs of memory cells belonging to the second group;
   a first signal line which is connectable to the first group of memory cells and which receives data stored in associated memory cells; and
   a second signal line which is connectable to the second group of memory cells and which receives data stored in associated memory cells,
   wherein each of the pairs of memory cells stores two sets of data having mutually opposite values.

10. The semiconductor memory device according to claim 9, further comprising:
    a sense amplifier which receives the complementary data received by the first and second signal lines and which outputs data recognized as data stored in the semiconductor memory device.

11. The semiconductor memory device according to claim 9, wherein the complementary data have mutually opposite logic level values.

12. The semiconductor memory device according to claim 9, wherein one memory cell of the respective pairs of memory cells stores a positive value and the other memory cell of the respective pairs of memory cells stores zero value.

* * * * *